United States Patent
Kulick

(10) Patent No.: US 9,274,544 B2
(45) Date of Patent: Mar. 1, 2016

(54) SIDEBAND INITIALIZATION

(75) Inventor: Stanley Steve Kulick, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 223 days.

(21) Appl. No.: 13/995,109

(22) PCT Filed: Dec. 22, 2011

(86) PCT No.: PCT/US2011/067009
§ 371 (c)(1),
(2), (4) Date: Jun. 17, 2013

(87) PCT Pub. No.: WO2013/095560
PCT Pub. Date: Jun. 27, 2013

(65) Prior Publication Data
US 2014/0040652 A1    Feb. 6, 2014

(51) Int. Cl.
*G06F 1/12* (2006.01)
*G11C 7/20* (2006.01)
*G06F 1/24* (2006.01)
*G11C 7/22* (2006.01)
*G11C 11/406* (2006.01)

(52) U.S. Cl.
CPC .. *G06F 1/12* (2013.01); *G06F 1/24* (2013.01); *G11C 7/20* (2013.01); *G11C 7/222* (2013.01); *G11C 11/40615* (2013.01)

(58) Field of Classification Search
CPC ................ G06F 1/12; G06F 1/24; G11C 7/20
See application file for complete search history.

(56) References Cited

U.S. PATENT DOCUMENTS

| | | | |
|---|---|---|---|
| 5,758,098 A | 5/1998 | Townsley et al. | |
| 6,424,688 B1 * | 7/2002 | Tan et al. | 375/354 |
| 6,748,039 B1 | 6/2004 | Bates | |
| 6,760,392 B1 * | 7/2004 | Tan et al. | 375/354 |
| 6,952,789 B1 * | 10/2005 | Azim et al. | 713/400 |
| 2003/0217213 A1 | 11/2003 | Imming et al. | |
| 2004/0059902 A1 | 3/2004 | Yeh et al. | |
| 2011/0231640 A1 | 9/2011 | Avadhanam | |

OTHER PUBLICATIONS

International Search Report and Written Opinion for PCT/US2011/067009 mailed Aug. 30, 2012, 9 pages.
International Preliminary Report on Patentability for PCT/US2011/067009 mailed Jul. 3, 2014, 6 pages.

* cited by examiner

*Primary Examiner* — Stefan Stoynov
(74) *Attorney, Agent, or Firm* — Blakely, Sokoloff, Taylor & Zafman LLP

(57) ABSTRACT

Initialization in multiple clock domains. A first die having a master initialization component generates initialization commands. A local initialization agent on the first die is coupled to receive the initialization commands. The local initialization agent manages initialization of one or more components on the first die. A remote initialization agent on a second die is coupled to receive the initialization commands. The remote initialization agent manages initialization of one or more components on the second die. The master initialization component receives acknowledgement messages from the local initialization agent and the remote initialization agent to manage conflicts and dependencies between the local initialization agent and the remote initialization agent and synchronizes events in multiple clock domains that share a reference clock signal by signaling in the reference clock domain.

24 Claims, 4 Drawing Sheets

SIDEBAND INITIALIZATION

TECHNICAL FIELD

Embodiments of the invention relate to input/output architectures and interfaces. More particularly, embodiments of the invention relate to high-bandwidth on-package input/output architectures and interfaces.

BACKGROUND

High bandwidth interconnections between chips using conventional input/output (I/O) interfaces require significant power and chip area. Thus, in applications requiring significantly reduced power consumption and/or smaller chip area, these conventional interfaces are not desirable.

BRIEF DESCRIPTION OF THE DRAWINGS

Embodiments of the invention are illustrated by way of example, and not by way of limitation, in the figures of the accompanying drawings in which like reference numerals refer to similar elements.

DETAILED DESCRIPTION

In the following description, numerous specific details are set forth. However, embodiments of the invention may be practiced without these specific details. In other instances, well-known circuits, structures and techniques have not been shown in detail in order not to obscure the understanding of this description.

Figure 1:
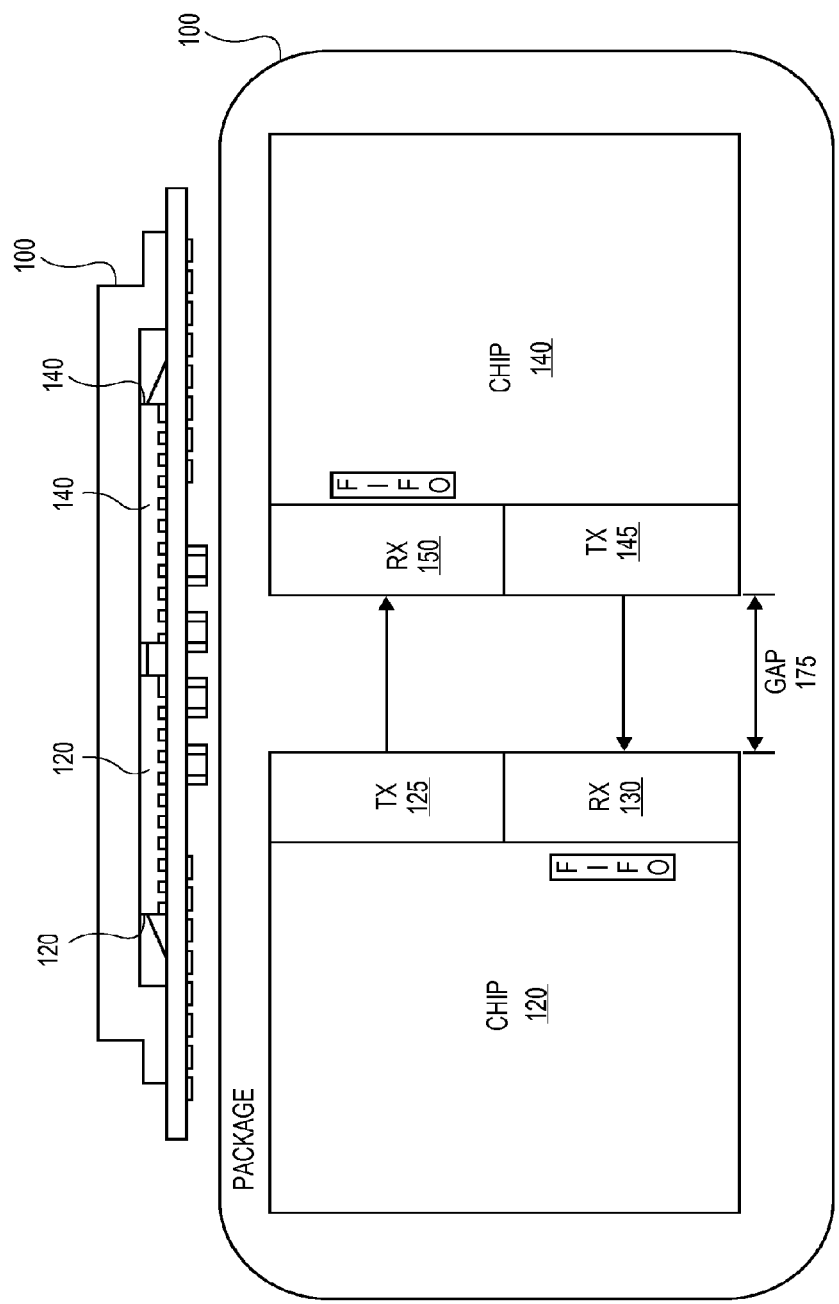
FIG. 1 is a block diagram of one embodiment of a multi-chip package (MCP) having on-package input/output (OPIO) interfaces between at least two chips.

FIG. 1 is a block diagram of one embodiment of a multi-chip package (MCP) having on-package input/output (OPIO) interfaces between at least two chips. The example of FIG. 1 illustrates two chips with interfaces; however, any number of chips within a package can be interconnected using the techniques described herein.

Package 100 may be any type of package that may contain multiple integrated circuit chips. In the example of FIG. 1, package 100 contains chip 120 and chip 140. These chips may be, for example, processors, memory chips, graphics processors, etc.

In one embodiment, chip 120 includes OPIO transmitters 125 and OPIO receivers 130. Similarly, chip 140 includes OPIO transmitters 145 and OPIO receivers 150. Transmitters 125 are coupled with receivers 150 and transmitters 145 are coupled with receivers 130.

In one embodiment, gap 175 between chip 120 and chip 140 is relatively small. In one embodiment, gap 175 is less than 20 mm. In one embodiment, gap 175 is less than 10 mm. In one embodiment, gap 175 is approximately 1.5 mm. In other embodiments, gap 175 may be less than 1.5 mm. In general, the smaller gap 175, the greater the bandwidth that may be provided between chips.

In one embodiment, the interfaces between transmitter 125 and receiver 150, and between transmitter 145 and receiver 130 are single-ended, relatively high-speed interfaces. In one embodiment, the interfaces are CMOS interfaces between chip 120 and chip 140. In one embodiment, transmitters 125 and 145 are impedance matched CMOS transmitters and no termination or equalization is provided. In one embodiment, transmitters 125 and 145 are impedance matched CMOS transmitters and very weak termination and no equalization is provided.

In one embodiment, a forwarded clock signal is transmitted for a cluster of signals. In one embodiment, length-matched routing is provided between the transmitters and the receivers. In one embodiment, minimal electrostatic discharge (ESD) protection (as little as 70 Volts) is provided for the interfaces between chips 120 and 140.

In one embodiment, use of a CMOS transmitter and receiver with no or weak receiver termination and no equalization can reduce I/O power. Simplified clocking with forwarded clock per cluster of signals and no per pin de-skew can be achieved due to careful length matched routing reduces clock power. Thus, the architectures described herein provide high bandwidth between chips at very low power, area and latency.

The architectures described herein can also be extended to close discrete packages with full ESD protection for small form factor mobile applications at lower data rates. Multi-level (e.g., M-PAM) signaling can be used at higher data rates to keep the clock frequency down.

Techniques described provide an initialization and/or power management sequencer in one system component to control a simpler device connected by an interface as described with respect to FIG. 1, where the interface provides a forwarded clock signal to the simpler device. In one embodiment, handshake sequences are utilized to trigger events in the simpler device after prerequisites in the controlling device are satisfied.

In one embodiment, a two-wire serial interface as described above may be used by a master device (e.g., a master state machine) to send commands to a remote slave device (e.g., a memory state machine) and information to a local slave device (e.g., a local state machine). When both slaves complete the command, they send an acknowledgement to the master. The master (or a sequencer working in/with the master) can reorder and/or repeat the commands. New steps may be added without changing the interface.

In one embodiment, the interface clock is provided by phase locked loops (PLLs) on both sides of the interface. FIFOs allow commands to be synchronized in different domains despite clock drifts larger than one clock period.

Figure 2:
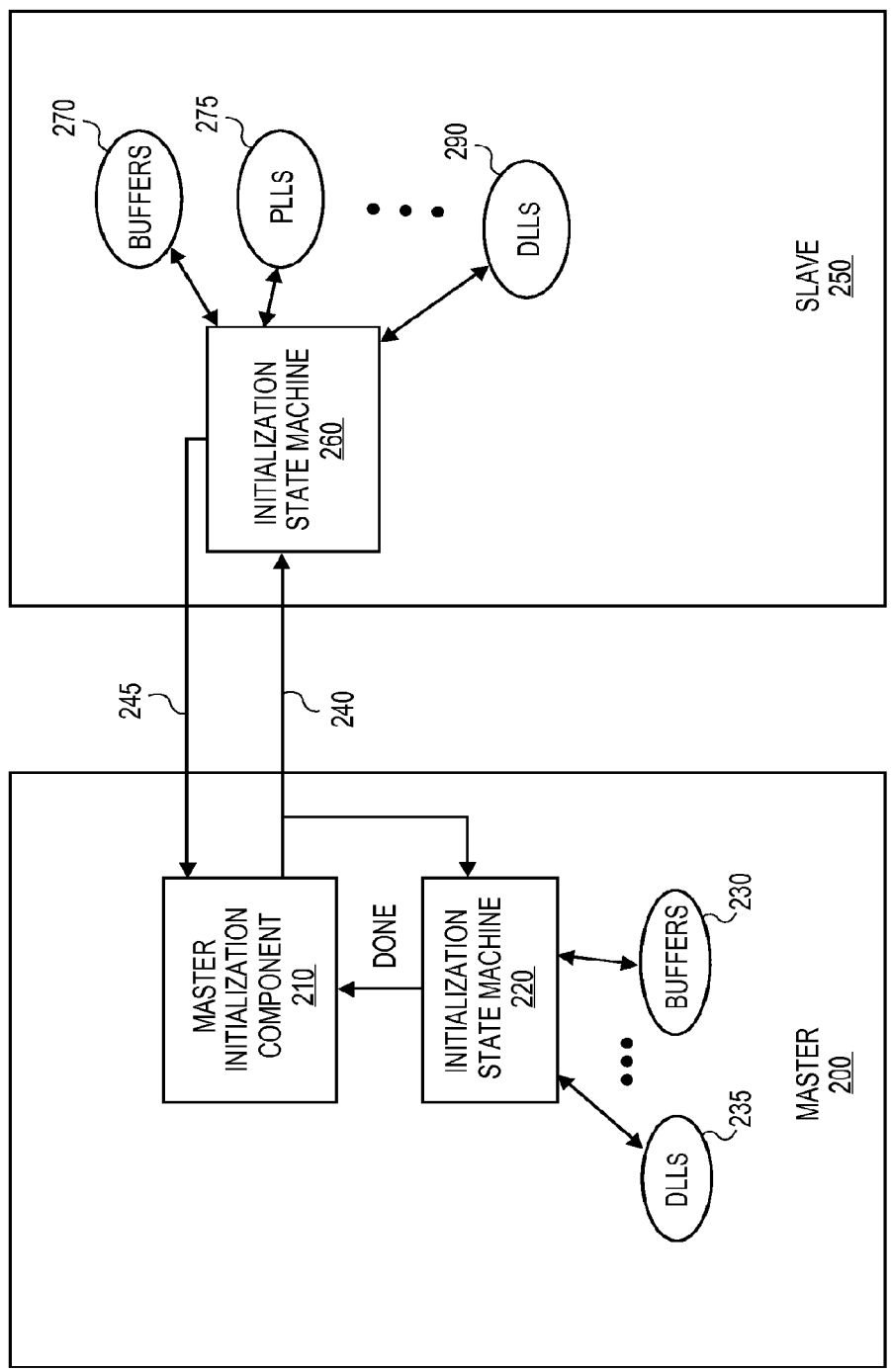
FIG. 2 is a block diagram of one embodiment of an arrangement for sideband initialization.

FIG. 2 is a block diagram of one embodiment of an arrangement for sideband initialization. Master device 200 may be, for example, a processor or other component that includes logic to provide some level of control to one or more components of slave device 250. Similarly, slave device 250 includes one or more components that provide some operation(s) in response to commands/signals from master device 200. Master device 200 may be, for example, a processor and slave device 250 may be, for example, a memory device. Other types of devices can also operate as the master or slave devices.

In one embodiment, initialization state machine 220 and initialization state machine 260 communicate via a virtual wire interface. This allows initialization state machine 220 to serially control handshakes and initialization elements on slave device 250. Initialization state machine 260 may report back to initialization state machine 220 to allow initialization state machine 220 to perform its own initialization operations and/or to manage other initialization operations.

In one embodiment, initialization state machine 220 and initialization state machine 260 are clocked by a common, or synchronized, clock signal. This enables synchronous communications between clock domains.

Master component 200 operates to at least start initiation of one or more elements within master device 200 and slave device 250. In one embodiment, one or more of the components of slave device 250 are to be initialized before one or more components of master device 200. In one embodiment, master component 210 issues serial commands over link 240 that are interpreted by initialization state machine 220 in master device 200 and by initialization state machine 260 in slave device 260. Dependencies may also exist in the other direction. A slave element may have a dependency on a master element.

In one embodiment, master component 210 generates command codes that are decoded by the state machines, which in turn perform specific initialization operations in response to receiving the command codes. Initialization state machine 220 may operate to initialize one or more components of master device 200. For example, initialization state machine 220 may operate to initialize one or more delay locked loops (DLLs) 235, one or more FIFOs 230 and/or other components of master device 200.

Similarly, initialization state machine 260 may operate to initialize one or more components of slave device 260. For example, initialization state machine 260 may operate to initialize one or more self refresh circuits, one or more fuses, one or more buffers 270, one or more PLLs 275, one or more DLLs 290 and/or other components of slave device 250.

In one embodiment, initialization state machine 260 provides an acknowledgement message over link 245 to indicate to master component 210 when commands have been completed and/or other actions have been accomplished. Similarly, initialization state machine 220 sends a "Done" signal to master component 210 when commands have been completed and/or other actions have been accomplished.

In one embodiment, master component 210 manages and joins the acknowledge messages from initialization state machine 260 and the Done messages from initialization state machine 220 to coordinate initialization of the various components (e.g., DLLs, PLLs, buffers) of master device 200 and slave device 250. Thus, master component 210 can manage the initialization of components on different chips and manage cross-chip dependencies that may exist. Further, master component 210 can provide a synchronized, deterministic communications scheme between master device 200 and slave device 250. In one embodiment, lines 240 and 245 represent one or more virtual wires to communicate between master device 200 and slave device 250.

Figure 3:
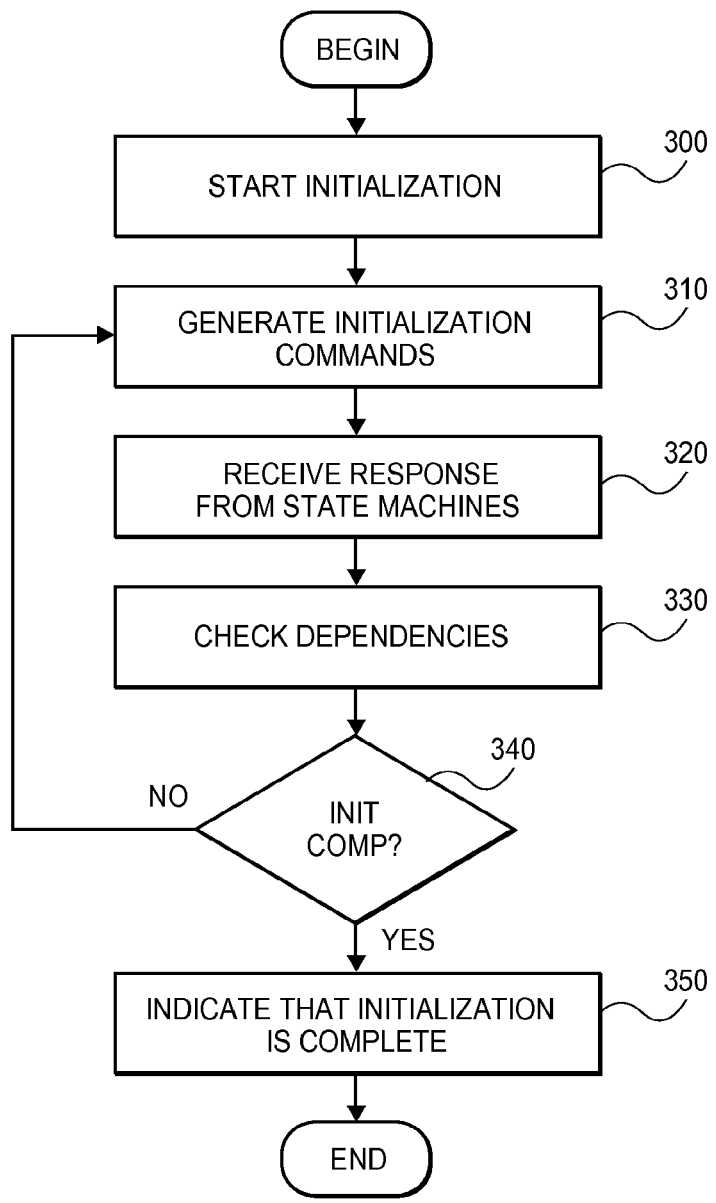
FIG. 3 is a flow diagram of one embodiment of a technique for sideband initialization.

FIG. 3 is a flow diagram of one embodiment of a technique for sideband initialization. The technique of FIG. 3 may be performed by the components of FIG. 2 that are interconnected with the interface of FIG. 1.

Initialization is started, 300. In one embodiment, the initialization is started by a master initialization component of a master device, (e.g., a processor core). The master initialization component may be a separate component or may be part of a larger control component, for example, a processor or controller.

The master initialization component generates initialization commands, 310. In one embodiment, the commands are transmitted over a serial interface and are codes to be decoded by the receiving control components. In one embodiment, the commands are transmitted over a virtual wire interface. In alternate embodiments, dedicated control lines may be used.

In one embodiment, the commands are provided to a local initialization state machine and to a remote initialization state machine. In one embodiment, the local initialization state machine operates on the same die as the master initialization component and the remote initialization state machine operates on a different die. The initialization state machines perform initialization operations in response to the commands received from the master initialization component.

The master initialization component receives responses from the initialization state machines, 320. The master initialization component manages conflicts, dependencies, and prerequisite requirements for the initialization state machines, 330. For example, if initialization of a local DLL must be performed after initialization of a remote PLL, the master initialization component controls the sequence of initialization. One example of dependency among initialization elements: PLL lock and impedance compensation required to forward a stable clock that can then be centered by a DLL FIFO. The centered forwarded clock can then be used to reset a FIFO.

If the initialization is not completed, 340, subsequent initialization commands may be generated, 310, and transmitted to the state machines. If the initialization is complete, 340, the master initialization component can indicate that initialization is complete, 350. The master device can then proceed with operation.

Figure 4:
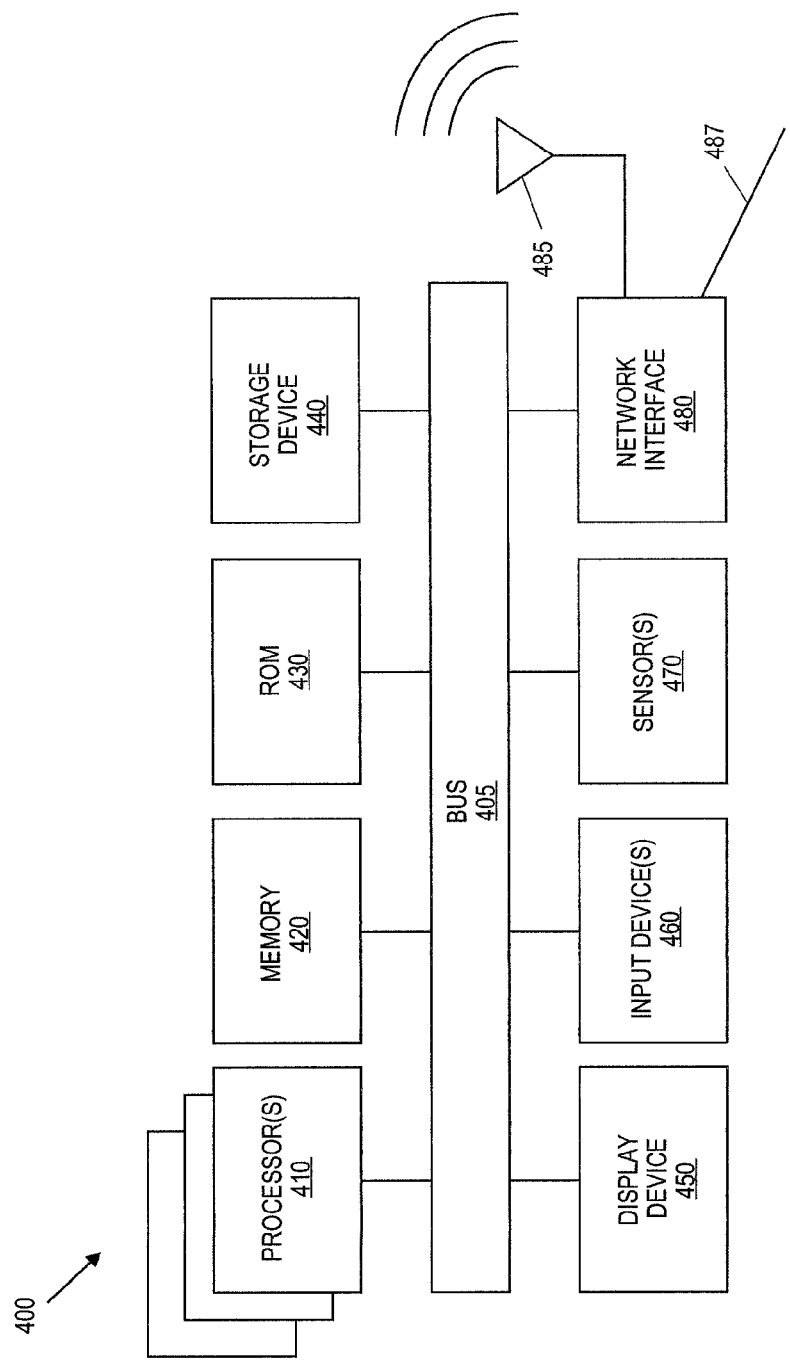
FIG. 4 is a block diagram of one embodiment of an electronic system.

FIG. 4 is a block diagram of one embodiment of an electronic system. The electronic system illustrated in FIG. 4 is intended to represent a range of electronic systems (either wired or wireless) including, for example, a tablet device, a smartphone, a desktop computer system, a laptop computer system, a server etc. Alternative electronic systems may include more, fewer and/or different components.

One or more of the components illustrated in FIG. 4 may be interconnected utilizing the OPIO architectures described herein. For example, multiple processor chips may be interconnected, or a processor and a cache memory or dynamic random access memory, etc.

Electronic system 400 includes bus 405 or other communication device to communicate information, and processor(s) 410 coupled to bus 405 that may process information. Electronic system 400 may include multiple processors and/or co-processors. Electronic system 400 further may include random access memory (RAM) or other dynamic storage device 420 (referred to as memory), coupled to bus 405 and may store information and instructions that may be executed by processor 410. Memory 420 may also be used to store temporary variables or other intermediate information during execution of instructions by processor(s) 410.

Electronic system 400 may also include read only memory (ROM) and/or other static storage device 430 coupled to bus 405 that may store static information and instructions for processor 410. Data storage device 440 may be coupled to bus 405 to store information and instructions. Data storage device 440 such as a magnetic disk or optical disc and corresponding drive may be coupled to electronic system 400.

Electronic system 400 may also be coupled via bus 405 to display device 450, which can be any type of display device, to display information to a user, for example, a touch screen. Input device 460 may be any type of interface and/or device to allow a user to provide input to electronic system 400. Input device may include hard buttons and/or soft buttons, voice or speaker input, to communicate information and command selections to processor(s) 410.

Electronic system 400 may further include sensors 470 that may be used to support functionality provided by Electronic system 400. Sensors 470 may include, for example, a gyroscope, a proximity sensor, a light sensor, etc. Any number of sensors and sensor types may be supported.

Electronic system 400 further may include network interface(s) 480 to provide access to a network, such as a local area network. Network interface(s) 480 may include, for example, a wireless network interface having antenna 485, which may represent one or more antenna(e). Network interface(s) 480 may also include, for example, a wired network interface to communicate with remote devices via network cable 487, which may be, for example, an Ethernet cable, a coaxial cable, a fiber optic cable, a serial cable, or a parallel cable.

In one embodiment, network interface(s) 480 may provide access to a local area network, for example, by conforming to IEEE 802.11b and/or IEEE 802.11g and/or IEEE 802.11n standards, and/or the wireless network interface may provide access to a personal area network, for example, by conforming to Bluetooth standards. Other wireless network interfaces and/or protocols can also be supported.

IEEE 802.11b corresponds to IEEE Std. 802.11b-1999 entitled "Local and Metropolitan Area Networks, Part 11: Wireless LAN Medium Access Control (MAC) and Physical Layer (PHY) Specifications: Higher-Speed Physical Layer Extension in the 2.4 GHz Band," approved Sep. 16, 1999 as well as related documents. IEEE 802.11g corresponds to IEEE Std. 802.11g-2003 entitled "Local and Metropolitan Area Networks, Part 11: Wireless LAN Medium Access Control (MAC) and Physical Layer (PHY) Specifications, Amendment 4: Further Higher Rate Extension in the 2.4 GHz Band," approved Jun. 27, 2003 as well as related documents. Bluetooth protocols are described in "Specification of the Bluetooth System: Core, Version 1.1," published Feb. 22, 2001 by the Bluetooth Special Interest Group, Inc. Associated as well as previous or subsequent versions of the Bluetooth standard may also be supported.

In addition to, or instead of, communication via wireless LAN standards, network interface(s) 480 may provide wireless communications using, for example, Time Division, Multiple Access (TDMA) protocols, Global System for Mobile Communications (GSM) protocols, Code Division, Multiple Access (CDMA) protocols, and/or any other type of wireless communications protocol.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

While the invention has been described in terms of several embodiments, those skilled in the art will recognize that the invention is not limited to the embodiments described, but can be practiced with modification and alteration within the spirit and scope of the appended claims. The description is thus to be regarded as illustrative instead of limiting.

What is claimed is:

1. An apparatus comprising:
   a first die having a master initialization component;
   a local initialization agent on the first die coupled to receive initialization commands generated by the master initialization component for the local initialization agent, the local initialization agent to manage initialization of one or more components on the first die;
   a remote initialization agent on a second die coupled to receive initialization commands generated by the master initialization component for the remote initialization agent, the remote initialization agent to manage initialization of one or more components on the second die;
   wherein the master initialization component is coupled to receive acknowledgement messages from the local initialization agent and the remote initialization agent and to manage conflicts and dependencies between the local initialization agent and the remote initialization agent.

2. The apparatus of claim 1 further comprising:
   a first set of transmitter circuits on the first die;
   a first set of receiver circuits on the second die, wherein the receiver circuits have no termination and no equalization.

3. The apparatus of claim 1, wherein the first die comprises at least a processor core, the apparatus further comprising a touch screen interface coupled with the processor core.

4. The apparatus of claim 1 wherein the first die comprises a processor core and the second die comprises a memory.

5. The apparatus of claim 1 wherein the first die, the second die and a plurality of conductive lines coupled between the first die and the second die are all disposed within a single integrated circuit package.

6. The apparatus of claim 1
   wherein the local initialization agent comprises a first state machine and the remote initialization agent comprises a second state machine.

7. The apparatus of claim 1 wherein the local initialization agent and the remote initialization agent are within different clock domains.

8. The apparatus of claim 1 wherein the local initialization agent and the remote initialization agent are clocked by a same clock signal.

9. A tablet computing device comprising:
   a touch screen interface;
   a first die having a master initialization component;
   a local initialization agent on the first die coupled to receive initialization commands generated by the master initialization component for the local initialization agent, the local initialization agent to manage initialization of one or more components on the first die;
   a remote initialization agent on a second die coupled to receive initialization commands generated by the master initialization component for the remote initialization agent, the remote initialization agent to manage initialization of one or more components on the second die;
   wherein the master initialization component is coupled to receive acknowledgement messages from the local initialization agent and the remote initialization agent and to manage conflicts and dependencies between the local initialization agent and the remote initialization agent.

10. The tablet of claim 9 further comprising:
    a first set of transmitter circuits on the first die;
    a first set of receiver circuits on the second die, wherein the receiver circuits have no termination and no equalization.

11. The tablet of claim 9 wherein the first die comprises a processor core and the second die comprises a memory.

12. The tablet of claim 9 wherein the first die, the second die and a plurality of conductive lines between the first die and the second die are all disposed within a single integrated circuit package.

13. The tablet of claim 9
    wherein the local initialization agent comprises a first state machine and the remote initialization agent comprises a second state machine.

14. The tablet of claim 9 wherein the local initialization agent and the remote initialization agent are within different clock domains.

15. The tablet of claim 9 wherein the local initialization agent and the remote initialization agent are clocked by a same clock signal.

16. A system comprising:
an omnidirectional antenna;
a first die having a master initialization component;
a local initialization agent on the first die coupled to receive initialization commands generated by the master initialization component for the local initialization agent, the local initialization agent to manage initialization of one or more components on the first die;
a remote initialization agent on a second die coupled to receive initialization commands generated by the master initialization component for the remote initialization agent, the remote initialization agent to manage initialization of one or more components on the second die;
wherein the master initialization component is coupled to receive acknowledgement messages from the local initialization agent and the remote initialization agent and to manage conflicts and dependencies between the local initialization agent and the remote initialization agent.

17. The system of claim 16, wherein the first die comprises at least a processor core, the system further comprising a touch screen interface coupled with the processor core.

18. The system of claim 16 further comprising:
a first set of transmitter circuits on the first die;
a first set of receiver circuits on the second die, wherein the receiver circuits have no termination and no equalization.

19. The system of claim 16 wherein the local initialization agent and the remote initialization agent are within different clock domains.

20. The system of claim 16 wherein the local initialization agent and the remote initialization agent are clocked by a same clock signal.

21. An apparatus, comprising:
a first semiconductor die, comprising:
a master initialization component;
a local initialization agent coupled to receive initialization commands generated by the master initialization component for the local initialization agent, the local initialization agent to manage initialization of one or more components on the first semiconductor die;
an interface through which the master initialization component is to communicate with a remote initialization agent on a second semiconductor die, the remote initialization agent to receive initialization commands generated by the master initialization component for the remote initialization agent, the remote initialization agent to manage initialization of one or more components on the second semiconductor die;
wherein the master initialization component is coupled to receive acknowledgement messages from the local initialization agent and the remote initialization agent and to manage conflicts and dependencies between the local initialization agent and the remote initialization agent.

22. The apparatus of claim 21 wherein the local initialization agent comprises a first state machine and the remote initialization agent comprises a second state machine.

23. The apparatus of claim 21 wherein the local initialization agent and the remote initialization agent are within different clock domains.

24. The apparatus of claim 21 wherein the local initialization agent and the remote initialization agent are clocked by a same clock signal.

* * * * *